United States Patent
Wang et al.

(10) Patent No.: US 9,496,288 B2
(45) Date of Patent: Nov. 15, 2016

(54) ARRAY SUBSTRATE, DISPLAY PANEL AND DISPLAY APPARATUS

(71) Applicants: Shanghai Tianma Micro-Electronics Co., Ltd, Shanghai (CN); Tianma Micro-Electronics Co., Ltd., Shenzhen (CN)

(72) Inventors: Chao Wang, Shanghai (CN); Zhaokeng Cao, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/467,650

(22) Filed: Aug. 25, 2014

(65) Prior Publication Data
US 2015/0287741 A1    Oct. 8, 2015

(30) Foreign Application Priority Data
Apr. 2, 2014    (CN) .......................... 2014 1 0130172

(51) Int. Cl.
*H01L 27/12*    (2006.01)
*H01L 23/522*    (2006.01)

(52) U.S. Cl.
CPC ......... *H01L 27/124* (2013.01); *H01L 23/5223* (2013.01); *H01L 23/5226* (2013.01); *H01L 27/1248* (2013.01); *H01L 27/1255* (2013.01); *H01L 2924/0002* (2013.01)

(58) Field of Classification Search
CPC .......................... H01L 27/3258; H01L 27/3265
See application file for complete search history.

(56) References Cited

U.S. PATENT DOCUMENTS

| | | | |
|---|---|---|---|
| 7,683,387 B2* | 3/2010 | Lee | G02F 1/133351 257/202 |
| 8,570,454 B2* | 10/2013 | Kim | G02F 1/13454 349/38 |
| 2001/0022365 A1* | 9/2001 | Murade | H01L 29/78609 257/59 |
| 2002/0196243 A1* | 12/2002 | Morita | G09G 3/3611 345/204 |

(Continued)

FOREIGN PATENT DOCUMENTS

| | | |
|---|---|---|
| CN | 103163699 A | 6/2013 |
| CN | 202975549 U | 6/2013 |

*Primary Examiner* — Mohammad Islam
*Assistant Examiner* — Ankush Singal
(74) *Attorney, Agent, or Firm* — Alston & Bird LLP

(57) ABSTRACT

An array substrate, a display panel and a display apparatus are provided. The array substrate includes a display region and a non-display region. The non-display region is provided with multiple gate driving circuits and multiple signal lines disposed outside the gate driving circuits. Each gate driving circuit includes at least one Thin Film Transistor and at least one capacitor. The capacitor includes a first plate and a second plate, and the capacitor is located above or below the signal lines. Since the capacitor is not arranged in a gate driving circuit region, a size of the gate driving circuit may be reduced. Accordingly, a width of a border of the display apparatus is further reduced, thereby achieving a narrow border design.

16 Claims, 6 Drawing Sheets

(56) References Cited

U.S. PATENT DOCUMENTS

| | | | | | |
|---|---|---|---|---|---|
| 2004/0095545 A1* | 5/2004 | Washizawa | G02F 1/13394 349/155 |
| 2006/0022920 A1* | 2/2006 | Lee | G09G 3/3677 345/87 |
| 2006/0157710 A1* | 7/2006 | Lee | H01L 27/13 257/72 |
| 2007/0064179 A1* | 3/2007 | Park | G02F 1/136209 349/110 |
| 2007/0103610 A1* | 5/2007 | Lee | G02F 1/136213 349/38 |
| 2007/0194710 A1* | 8/2007 | Song | H01L 27/3276 313/512 |
| 2007/0278480 A1* | 12/2007 | Hwang | H01L 27/3244 257/40 |
| 2008/0149935 A1* | 6/2008 | Lee | G02F 1/133351 257/72 |
| 2008/0149937 A1* | 6/2008 | Moriwaki | H01L 27/124 257/72 |
| 2008/0158217 A1* | 7/2008 | Hata | G06F 3/14 345/211 |
| 2008/0225026 A1* | 9/2008 | Uchino | G09G 3/3233 345/204 |
| 2009/0065780 A1* | 3/2009 | Yasukawa | H01L 29/42384 257/71 |
| 2009/0091671 A1* | 4/2009 | Tsubata | G02F 1/1345 349/38 |
| 2010/0141293 A1* | 6/2010 | Chen | G09G 3/006 324/760.01 |
| 2010/0156779 A1* | 6/2010 | Park | G02F 1/167 345/107 |
| 2010/0163879 A1* | 7/2010 | Jung | G02F 1/13454 257/59 |
| 2012/0133627 A1* | 5/2012 | Moon | G09G 3/3648 345/208 |
| 2012/0169229 A1* | 7/2012 | You | H01L 27/3244 315/51 |
| 2013/0009154 A1* | 1/2013 | Choi | H01L 27/124 257/59 |
| 2013/0249877 A1* | 9/2013 | Choi | G09G 3/20 345/205 |
| 2013/0300775 A1* | 11/2013 | Choi | G02B 26/005 345/690 |
| 2013/0328752 A1* | 12/2013 | Iida | G09G 3/3266 345/77 |
| 2014/0092082 A1* | 4/2014 | Choi | G09G 3/3696 345/213 |
| 2014/0300649 A1* | 10/2014 | Park | G09G 3/006 345/690 |
| 2014/0339508 A1* | 11/2014 | Hong | H01L 27/3258 257/40 |
| 2014/0340625 A1* | 11/2014 | Hsu | G02F 1/13458 349/153 |
| 2015/0035818 A1* | 2/2015 | Shin | G09G 3/3648 345/212 |
| 2015/0084014 A1* | 3/2015 | Kim | H01L 27/3223 257/40 |
| 2015/0138465 A1* | 5/2015 | Huang | G02F 1/133345 349/38 |
| 2015/0243720 A1* | 8/2015 | Kwon | H01L 27/1248 257/40 |

* cited by examiner

US 9,496,288 B2

ARRAY SUBSTRATE, DISPLAY PANEL AND DISPLAY APPARATUS

CROSS-REFERENCES TO RELATED APPLICATIONS

This application claims the benefit of priority to Chinese Patent Application No. 201410130172.0, filed with the Chinese Patent Office on Apr. 2, 2014 and entitled "ARRAY SUBSTRATE, DISPLAY PANEL AND DISPLAY APPARATUS", the content of which is incorporated herein by reference in its entirety.

FIELD OF THE INVENTION

The present disclosure relates to the field of display technology, and more particularly to an array substrate, a display panel including the array substrate, and a display apparatus including the array substrate.

BACKGROUND OF THE INVENTION

As the display technologies develop, a display apparatus tends to have a narrow border design. The display apparatus is designed with a larger screen and narrower borders. For a display apparatus having a fixed size, the narrow border design leads to a large screen, thereby improving the display effect of the display apparatus.

Conventionally, integrating gate driving circuits on a display panel is one of the most important solutions to achieve narrow borders. By integrating the gate driving circuits on the display panel rather than using a traditional gate driving integrated circuit, not only material cost and manufacturing process of a product may be reduced, but also the reliability of the product may be improved. The display apparatus is lighter and the narrow border design is achieved.

However, the borders of the conventional display panel may further be designed narrower.

BRIEF SUMMARY OF THE INVENTION

An array substrate is provided according to an embodiment of the disclosure. The array substrate includes a display region and a non-display region. The non-display region is provided with multiple gate driving circuits and multiple signal lines disposed outside the gate driving circuits. The signal lines and at least one of a gate line and a data line are located in a same layer. Each gate driving circuit includes a TFT device and a capacitor. The gate driving circuit is respectively connected to the signal lines and a related component in the display region via leads. The capacitor includes a first plate and a second plate, and the capacitor is located above or below the signal lines.

Another embodiment of the disclosure provides a display panel including the foregoing array substrate.

Another embodiment of the disclosure provides a liquid crystal display apparatus including the foregoing display panel.

BRIEF DESCRIPTION OF THE DRAWINGS

FIG. 3b is a sectional view of the layout of the portion, taken along the line A-A' shown in FIG. 3a;
FIG. 5b is a sectional view of the portion 5, taken along the line B-B' shown in FIG. 5a;
FIG. 6b is a sectional view of the pixel unit, taken along the line C-C' shown in FIG. 6a.

DETAILED DESCRIPTION OF THE INVENTION

In accordance with embodiments of the disclosure, a capacitor may arranged above or below a signal line. Hence, the capacitor may not contribute an extra width to a border. Accordingly, a width of the border of a display apparatus is further reduced and a narrow border design is achieved.

Figure 1:
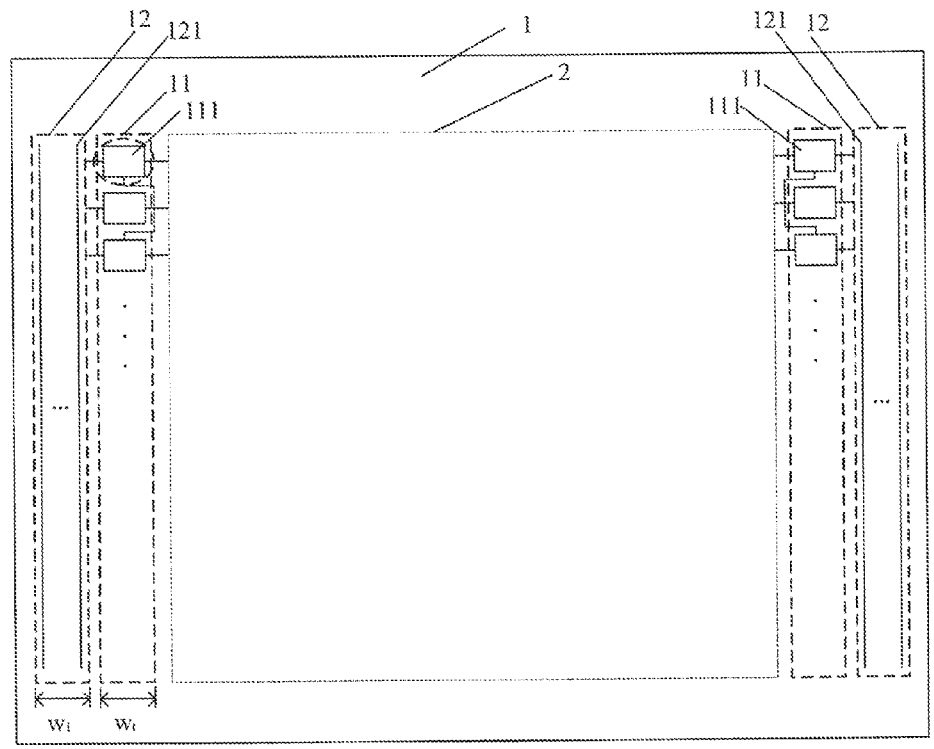
FIG. 1 is a schematic plan view of a conventional array substrate provided with gate driving circuits.

A structure of a display panel is shown in FIG. 1. The display panel includes a display region 2 and a non-display region 1. The non-display region 1 includes: gate driving circuit regions 11 provided with multiple cascading gate driving circuits 111, and signal line regions 12 located outside the gate driving circuits and provided with signal lines 121. Both the gate driving circuit regions 11 and the signal line regions 12 outside the gate driving circuits are symmetrically arranged on two exterior sides of the display region 2. As shown in FIG. 1, a width W of one border of the display panel is equal to the sum of a width W1 of the signal line region and a width Wt of the gate driving circuit region, i.e., W=W1+Wt.

Figure 2:
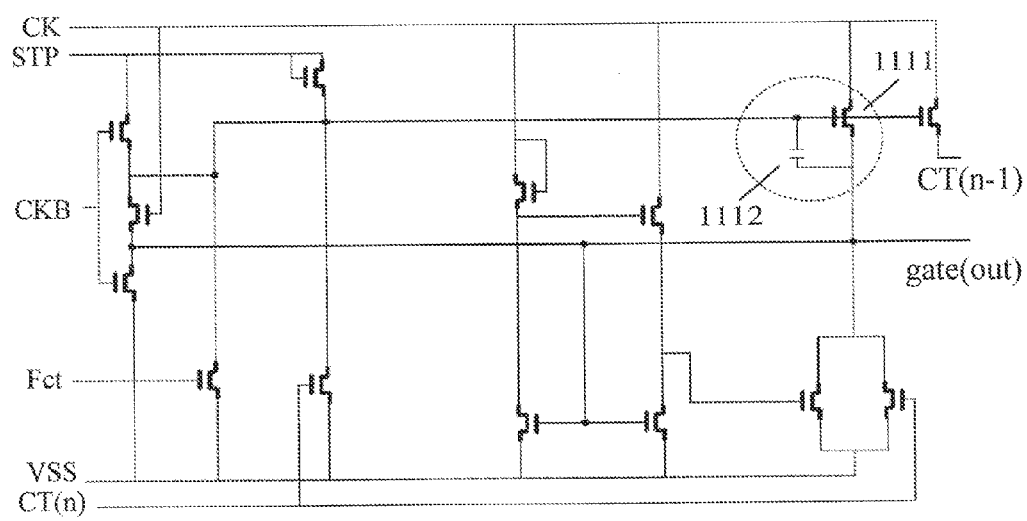
FIG. 2 is a schematic diagram of a gate driving circuit.
Figure 3A:
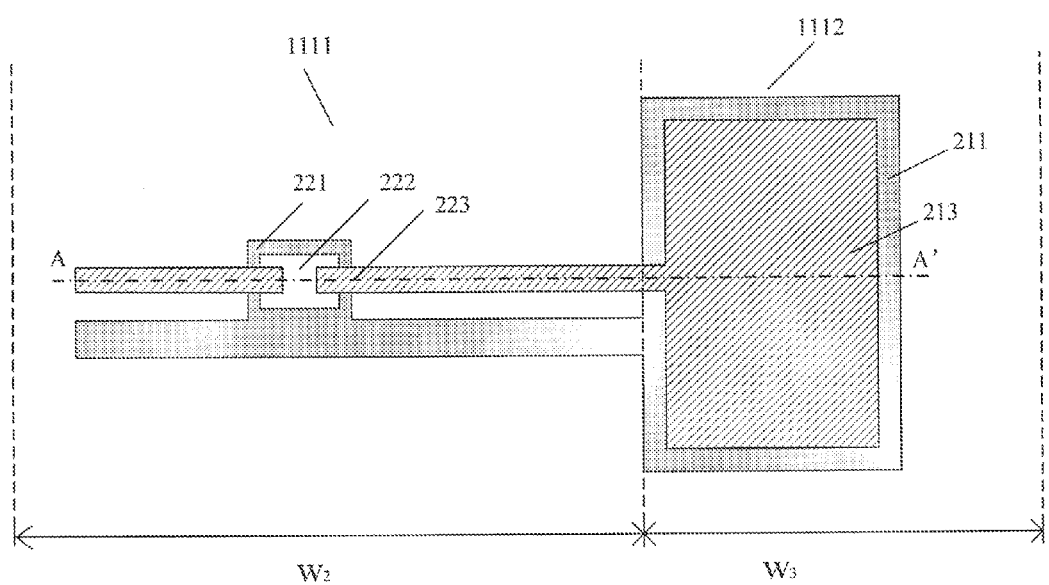
FIG. 3a is a plan view of a layout of a portion shown in a dashed circle in FIG. 2.

FIG. 2 is a schematic diagram of one gate driving circuit. Generally, the gate driving circuit is at least provided with one Thin Film Transistor (TFT) device 1111 and one capacitor 1112, which are shown by the dashed circle in FIG. 2. FIG. 3a is a plan view of a layout of the portion shown in the dashed circle in FIG. 2. Usually, a gate electrode 221 of the TFT device and a lower plate 211 of the capacitor are located on a same layer and are manufactured with a same metal material in a same process. A layer 222 represents a semiconductor layer of the TFT device. Usually, a drain electrode 223 of the TFT device and an upper plate 213 of the capacitor are located in a same layer and are manufactured with a same metal material in a same process. In FIG. 3a, one TFT device and one capacitor are shown, however, a dielectric layer between the upper plate and the lower plate of the capacitor is not shown. W2 represents a width of a TFT device region. All TFT devices of the gate driving circuit and all lines connecting the TFT devices are arranged in the TFT device region. The width of the TFT device region is usually greater than the width of one TFT device shown in FIG. 3a. W3 represents a width of a capacitor region. The width Wt of the gate driving circuit region is equal to a sum of W2 and W3, and accordingly, the width W of one border of the display panel is equal to the sum of W1, W2 and W3. Different from conventional technologies, in the array substrate, the display panel and the display device according to the embodiments of the disclosure, the capacitor is arranged above or below the signal lines. Hence, the capacitor may not contribute an additional width to a border. Accordingly, a width of the border of the display apparatus may be further reduced, thereby achieving a narrow border design.

Figure 3B:
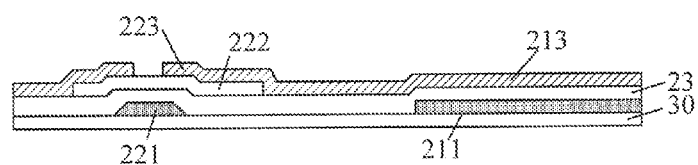

FIG. 3b is a cross-sectional view of the TFT device 1111 and the capacitor 1112 taken along the line A-A' in FIG. 3a. The TFT device 111 is shown as including the gate electrode 221 disposed on a layer 30, the semiconductor layer 222, and the drain electrode 223. The capacitor 1112 is shown as including the lower plate 211 disposed on the layer 30, the upper plate 223, and an insulator layer 23 interposed between the upper plate and the lower plate. The layer 23 is also interposed between the semiconductor layer 222 and the gate electrode 221.

Figure 4:
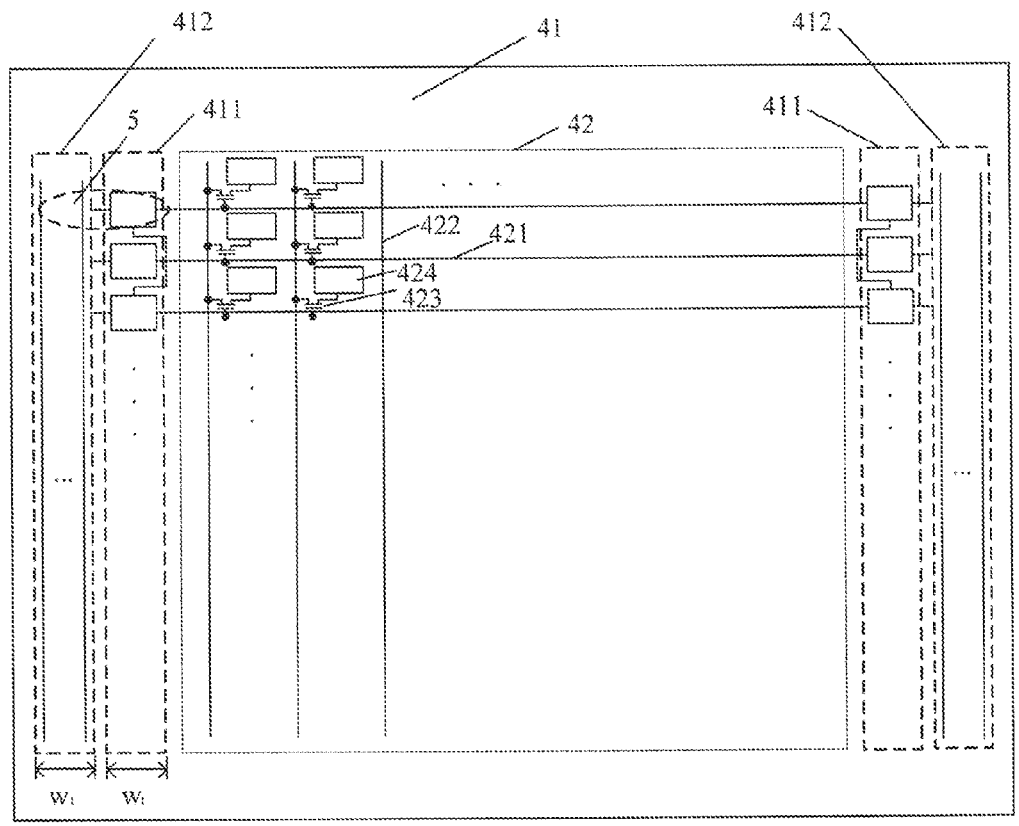
FIG. 4 is a schematic plan view of an array substrate according to an embodiment of the disclosure.

FIG. 4 illustrates a schematic plan view of the array substrate according to one embodiment of the disclosure. The array substrate includes a display region 42 and a non-display region 41. Multiple gate lines 421, multiple data lines 422 and pixel units are provided in the display region 42. The data lines cross the gate lines and are insulated from the gate lines, and the pixel units are arranged in pixel regions defined by the intersections of the data lines and the gate lines. Each pixel unit includes a TFT 423 acting as a pixel switch and a pixel electrode 424 electrically connected to the TFT 423. The non-display region 41 is provided with gate driving circuits (located in gate driving circuit regions 411) and signal lines (located in signal line regions 412) outside the gate driving circuits.

The gate driving circuit region is provided with cascaded gate driving circuits. Each gate driving circuit includes an output end for outputting a row scanning signal. The row scanning signal is output via the output end to the gate line in the display region 42 of the array substrate, to drive one row of pixels in the display region 42 to be turned on or turned off. An output signal of each gate driving circuit is taken as a reset signal for a previous gate driving circuit or a precharge signal for a next gate driving circuit. Thus, a progressive scanning of a display apparatus is achieved. Various signals (such as a clock signal, a reset signal) are input to the gate driving circuits via the signal lines arranged in the signal line regions outside the gate driving circuits.

Figure 5A:
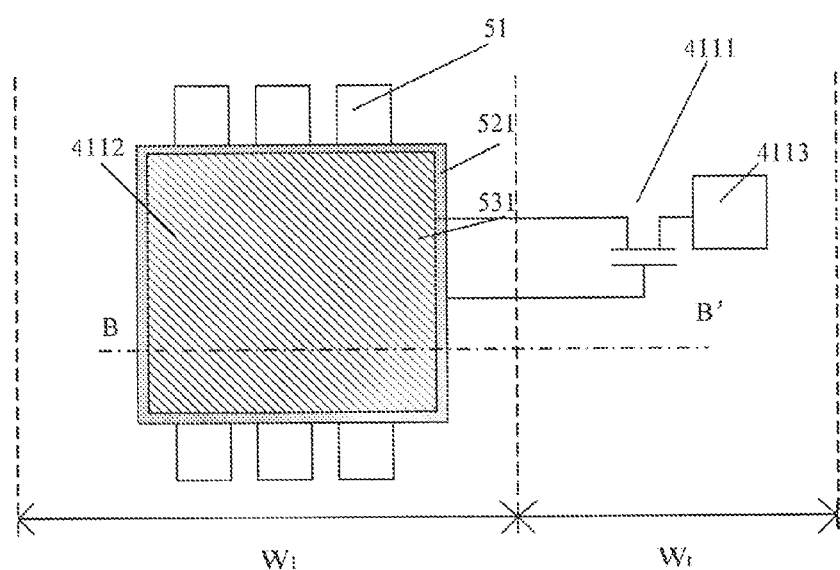
FIG. 5a is an enlarged view of a portion 5 shown in a dashed circle in FIG. 4.
Figure 5B:
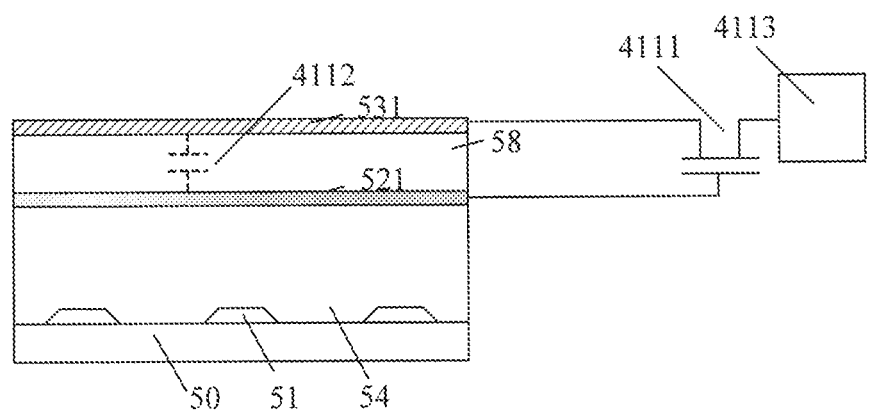

FIG. 5a is an enlarged view of a portion 5 shown in a dashed circle in FIG. 4, and FIG. 5b is a sectional view of the portion 5, taken along the line B-B' shown in FIG. 5a. As shown in FIG. 5a and FIG. 5b, the gate driving circuit includes at least one TFT 4111 and one capacitor 4112. The capacitor is arranged above the signal lines (alternatively, the capacitor may be arranged below the signal lines) and is insulated from the signal lines 51 via a first insulating layer 54. The capacitor 4112 includes a first plate 531, a second plate 521 and a second insulating layer 58 provided between the first plate 531 and the second plate 521. A lower substrate 50, the first insulating layer 54 and the second insulating layer 58 shown in FIG. 5b are not shown in FIG. 5a. It should be noted that in FIG. 5a and FIG. 5b, only one capacitor and one TFT are illustrated as an example. Alternatively, multiple capacitors may be arranged above or below the signal lines. Usually, the gate driving circuit includes multiple TFTs and other elements. In FIG. 5a, a white block 4113 electrically connected to the TFT represents elements other than the TFT. The structure of the white block 4113 may be implemented with a common structure of a conventional gate driving circuit, such as a structure of elements other than the TFT 4111 and the capacitor 4112 in FIG. 2. Alternatively, an element 531 may represent a second plate, and an element 521 may represent a first plate.

In addition, signals applied via the signal lines 51 are input signals required by the gate driving circuit, which may include various pulse signals and various constant level signals. The pulse signals include a clock signal, an initiation signal and a reset signal. The clock signal is for generating respective gate signals. The initiation signal is for generating a first gate signal. The reset signal is for achieving a reset in the case that a panel begins to display. The constant level signals include a high level signal VGH and a low level signal VGL. The number of the signal lines varies with different gate driving circuits. The signal lines 51 are located in a same layer as at least one of the gate lines and the data lines. In a first case, the signal lines are located in a single layer, which is a same layer as the gate lines. In a second case, the signal lines are located in a single layer, which is a same layer as the data lines. In a third case, the signal lines are located in two layers, where a part of the signal lines are located in a same layer as the gate lines, and a part of the signal lines are located in a same layer as the data lines.

As shown in FIG. 4, FIG. 5a and FIG. 5b, a width of the signal line region 412 is W1, a width of the gate driving circuit region 411 is Wt, and the width W1 of the signal line region is larger than a width W3 of the capacitor. Hence, a width W of one border of a display panel is equal to the sum of the width W1 of the signal line region and the width Wt of the gate driving circuit region 411, i.e., W=W1+Wt. Since the capacitor is arranged above or below the signal lines, the width W3 of the capacitor may not contribute to the width Wt of the gate driving circuit region, and accordingly, the width Wt of the gate driving circuit region is equal to a width W2 of a TFT device region shown in FIG. 3a. That is to say that W=W1+W2. The width of the border of the display panel according to the embodiment of the disclosure is smaller than that of a conventional display panel by the width W3 of the capacitor. Hence, a width of the border of a display apparatus is reduced. It should be noted that, generally, the width W1 of the signal line region is greater than the width W3 of the capacitor, thus the width W of one border of the display panel is equal to the sum of the width W1 of the signal line region and the width W2 of the TFT device region. According to other embodiments of the disclosure, the width W1 of the signal line region may be smaller than the width W3 of the capacitor. In this case, the width W of one border of the display panel is equal to the sum of the width W2 of the TFT device region and the width W3 of the capacitor, and accordingly, the width of the border of the display panel here is smaller than that of the conventional display panel by the width W1 of the signal line region. Hence, the width of the border of the display apparatus is reduced. According to any of the above embodiments, the width W1 of the signal line region and the width W3 of the capacitor may not simultaneously contribute to the width W of the border. Hence, a narrower border may be further achieved.

In the array substrate, both the first plate and the second plate of the capacitor may be made of a metal material, or made of a transparent material. Alternatively, one of the first plate and the second plate is made of a metal material, and the other is made of a transparent material. The transparent material may be a transparent metal oxide, for example, the transparent material may include at least one of InGaZnO, InGaO, ITZO, and AlZnO.

For a plate made of the metal material, at least one hole may be provided. Hence, a UV transmittance may be improved when performing a seal agent curing on a liquid crystal display panel. Accordingly, a UV curing efficiency is improved and a product productivity is improved.

An array substrate is provided according to another embodiment of the disclosure. Similar parts of the array substrate according to the embodiment and the array substrate according to the above embodiment are not further described here. Optionally, at least one of two plates of a capacitor according to the embodiment may be located in a same layer as a pixel array and may be made of a same material as the pixel array. In this way, the capacitor and the pixel array may be manufactured with a same process, where no extra process is involved for manufacturing the capacitor, thereby saving costs.

Figure 6A:
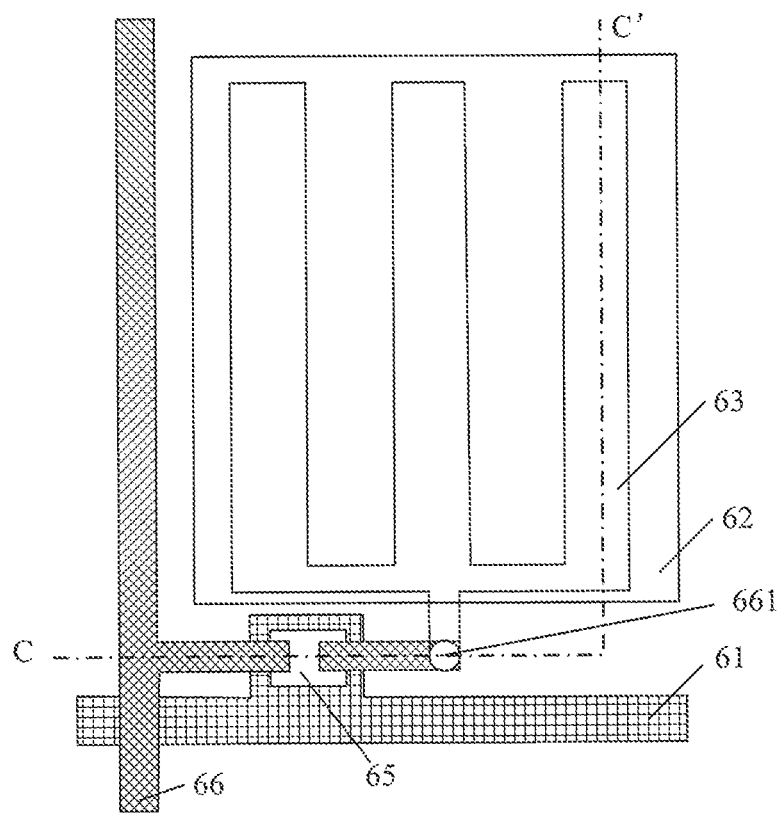
FIG. 6a is a schematic plan view of a pixel unit.
Figure 6B:
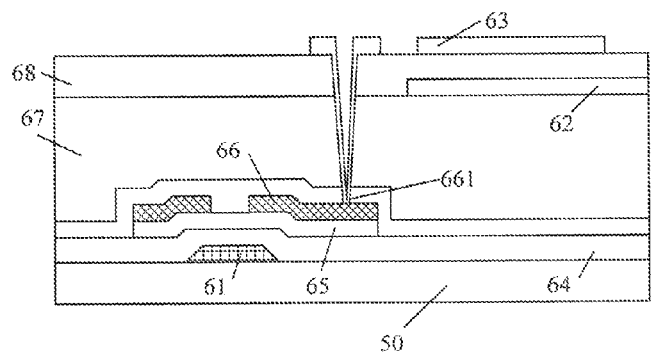

FIG. 6a is a plan view of a pixel unit in a display region, and FIG. 6b is a sectional view of the pixel unit, taken along the line C-C' shown in FIG. 6a. As shown in FIG. 6a and FIG. 6b, the display region is provided with a data line 66 and a gate line 61, which are insulated from each other and crossed with each other. A pixel unit is arranged in a pixel region defined by adjacent data lines and adjacent gate lines. Alternatively, the pixel unit is arranged at an intersection of the data line 66 and the gate line 61. The pixel unit includes a TFT, a pixel electrode and a common electrode. The pixel unit shown in FIGS. 6a and 6b has a single domain structure, and the pixel electrode is located above the common electrode. The disclosure is not limited to this case. The pixel electrode may be located below the common electrode, and the pixel unit may have a dual-domain structure, a pseudo-dual domain structure, or a multi-domain structure. The TFT may be an amorphous silicon (a-Si) TFT, a poly silicon (Poly-Si) TFT, or an amorphous silicon oxide TFT. The TFT may have a top-gate structure and a bottom-gate structure.

Figure 7A:
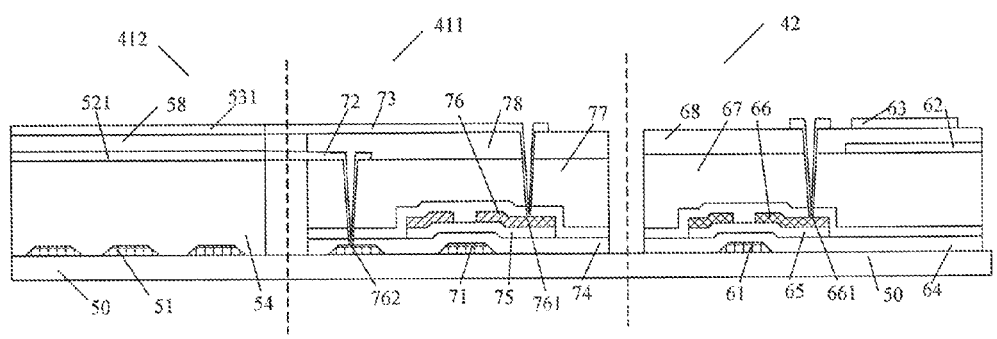
FIG. 7a is a comparison diagram of sectional views of a signal line region, a TFT device region, and a pixel unit.

As shown in the display region 42 and the signal line region 412 in FIG. 7a, the pixel electrode 63 and the first plate 531 are located in a same layer and formed with a same material in a same process. The common electrode 62 and the second plate 521 are located in a same layer and formed with a same material in a same process. Thus no extra process is involved for manufacturing the capacitor and cost is accordingly saved. Since the positions of the pixel electrode and the common electrode may be exchanged, the first plate may be arranged below the second plate. Hence, the pixel electrode and the first plate may be located in a same layer and formed with a same material in a same process, and the common electrode and the second plate may be located in a same layer and formed with a same material in a same process. As shown in FIG. 7a, no hole is required to be provided on the plates of the capacitor since both the first plate 531 and the second plate 521 of the capacitor are made of a transparent material. The process is simplified and the UV transmittance is significantly improved when performing the seal agent hardening, thereby improving product productivity. Alternatively, the first plate 531 and one of the pixel electrode 63 and the common electrode 62 may be located in a same layer and formed with a same material in a same process, while the second plate 521 is manufactured individually. Similarly, the second plate 521 and one of the pixel electrode 63 and the common electrode 62 may be located in a same layer and formed with a same material in a same process, while the first plate 531 is manufactured individually. Since the positions of the pixel electrode and the common electrode may be exchanged, the first plate may be located below the second plate. The second plate and one of the common electrode and the pixel electrode may be located in a same layer and formed with a same material in a same process, while the first plate is manufactured individually. Similarly, the first plate and one of the pixel electrode and the common electrode may be located in a same layer and formed with a same material in a same process, while the second plate is manufactured individually.

According to the embodiment, the first plate and the second plate of the capacitor should be respectively electrically connected to a related TFT device in the gate driving circuit, to achieve functions of the capacitor, such as a signal coupling and a bootstrap, in the gate driving circuit. As shown in FIG. 7a, in the signal line region, the first insulating layer 54 is provided between the signal lines 51 and the second plate 521, and the second insulating layer 58 is provided between the first plate 531 and the second plate 521. In the pixel unit in the display region 42, a third insulating layer 64 and a semiconductor layer 65 are provided between a gate metallic layer 61 and a data metallic layer 66, a fourth insulating layer 67 is provided between the data metallic layer 66 and the common electrode 62, and a fifth insulating layer 68 is provided between the common electrode 62 and the pixel electrode 63. In the TFT device region 411, a sixth insulating layer 74 and a semiconductor layer 75 are provided between a gate line metallic layer 71 and a data line metallic layer 76, and a seventh insulating layer 77 and an eighth insulating layer 78 are provided above the data line metallic layer. Here via holes may be provided through the fourth and/or the fifth insulating layers, and the seventh and/or the eighth insulating layers. The first plate 531 of the capacitor located above the signal line region 412 is connected to a source electrode or a drain electrode of one TFT device in the gate driving circuit through a via hole 761, and the second plate 521 of the capacitor is connected to a gate electrode of one TFT device in the gate driving circuit through a via hole 762. The via hole 761 penetrates through the eighth insulating layer 78 and the seventh insulating layer 77 to expose the data line metallic layer 76. The via hole 762 penetrates through the seventh insulating layer 77 and the sixth insulating layer 74 to expose the gate line metallic layer 71. As circuit design requires, the first plate 531 of the capacitor may be connected to the gate electrode of one TFT device through a via hole, where the via hole penetrates through the eighth insulating layer 78, the seventh insulating layer 77 and the sixth insulating layer 74 to expose the gate metallic layer 71. The second plate 521 of the capacitor may be connected to the source electrode or the drain electrode of one TFT device through a via hole, where the via hole penetrates through the seventh insulating layer 77 to expose the data line metallic layer 76. It should be understood that, one of the first plate and the second plate of the capacitor may be electrically connected to the gate electrode or the source electrode or the drain electrode of one related TFT device through one via hole, and the other of the first plate and the second plate may be electrically connected to the gate electrode or the source electrode or the drain electrode of one related TFT device through another via hole. The via holes are not limited within the gate driving circuit region, and may be provided anywhere within the non-display region 41 based on circuit requirements.

As shown in FIG. 7a, a wire 73, which connects the first plate 531 of the capacitor to the source electrode or the drain electrode of the TFT device through the via hole 761, may be manufactured individually. Alternatively, the wire 73 and one of the pixel electrode 63 and the common electrode 62 may be located in a same layer and formed with a same material in a same process. A wire 72, which connects the second plate 521 of the capacitor to the gate electrode of the TFT device through the via hole 762, may be manufactured individually. Alternatively, the wire 72 and one of the common electrode 62 and the pixel electrode 63 may be located in a same layer and formed with a same material in a same process. Since the positions of the pixel electrode and the common electrode may be exchanged, the first plate may be arranged below the second plate. A wire, which connects the second plate of the capacitor to the source electrode or the drain electrode of the TFT device through the via hole, may be manufactured individually. Alternatively, the wire and the common electrode or the pixel electrode may be located in a same layer and formed with a same material in a same process. A wire, which connects the first plate of the capacitor to the gate electrode of the TFT device through the via hole, may be manufactured individually. Alternatively, the wire and the pixel electrode or the common electrode may be located in a same layer and formed with a same material in a same process.

As shown in FIG. 7a, in the signal line region, the first insulating layer 54 is provided between the signal line 51 and the second plate 521, and the second insulating layer 58 is provided between the first plate 531 and the second plate 521. In the pixel unit in the display region 42, the third insulating layer 64 and the semiconductor layer 65 are provided between the gate line metallic layer 61 and the data line metallic layer 66, the fourth insulating layer 67 is provided between the data line metallic layer 66 and the common electrode 62, and the fifth insulating layer 68 is provided between the common electrode 62 and the pixel electrode 63. In the TFT device region 411, the sixth insulating layer 74 and the semiconductor layer 75 are provided between the gate line metallic layer 71 and the data line metallic layer 76, and the seventh insulating layer 77 and the eighth insulating layer 78 are provided above the data line metallic layer. The insulating layers include at least one of an organic layer and an inorganic layer, and may be single-layer films or laminated films. Generally, the third insulating layer 64 is a gate insulating layer, the fourth insulating layer 67 includes a passivation layer and an organic layer, and the fifth insulating layer 68 is a passivation layer. The sixth insulating layer 74 and the third insulating layer 64 may be located in a same layer and formed with a same material in a same process. The seventh insulating layer 77 and the fourth insulating layer 67 may be located in a same layer and formed with a same material in a same process. The eighth insulating layer 78 and the fifth insulating layer 68 may be located in a same layer and formed with a same material in a same process. The signal lines 51 may be arranged in a single layer same as the gate line metallic layer. Hence, the first insulating layer 54 and at least one layer in the third insulating layer 64 and the fourth insulating layer 67 may be located in a same layer and formed with a same material in a same process, i.e., the first insulating layer 54 may include at least one of the gate insulating layer, the passivation layer and the organic layer. Alternatively, the signal lines 51 may be arranged in a single layer same as the data line metallic layer. Hence, the first insulating layer 54 and at least one layer in the third insulating layer 64 may be located in a same layer and formed with a same material in a same process, i.e., the first insulating layer 54 may include at least one of the passivation layer and the organic layer. Alternatively, the signal lines 51 may be arranged in two layers, a part of the signal lines are located in a same layer as the gate metallic layer, and a part of the signal lines are located in a same layer as the data metallic layer. Hence, the first insulating layer 54 and at least one layer in the fourth insulating layer 67 may be located in a same layer and formed with a same material in a same process, i.e., the first insulating layer 54 may include at least one of the passivation layer and the organic layer. The second insulating layer 58 and the fifth insulating layer 68 may be located in a same layer and formed with a same material in a same process.

Since the capacitor is arranged above the signal lines, in order to maintain the stability of the capacitor, the first insulating layer 54 provided between the signal lines 51 and the second plate or the first plate should be thick enough, so that a pulse signal in the signal lines does not interfere with the capacitor, or pulse interference caused by the pulse signal may not affect a normal operation of the capacitor. For this purpose, the first insulating layer 54 should have a thickness equal to or greater than 5000 Å.

The insulating layers may be single-layer films made of silicon nitride, silicon oxide or silicon oxynitride. Alternatively, the insulating layers may be laminated films made of the materials described above. The insulating layers may be manufactured through a chemical vapor deposition, a thermal evaporation or the like.

Figure 7B:
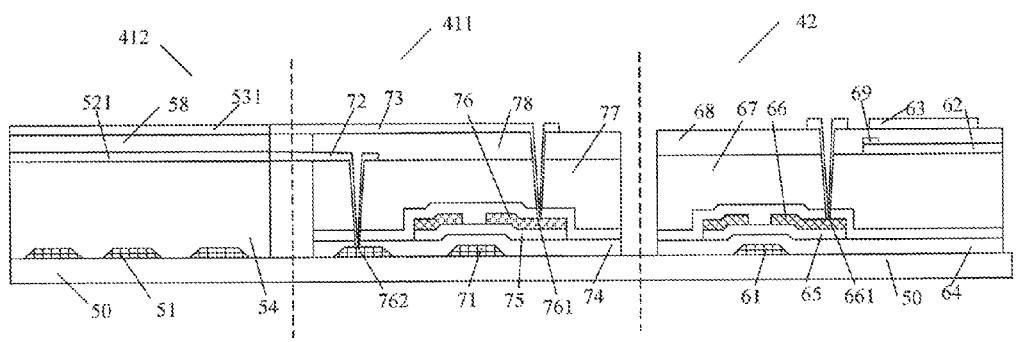
FIG. 7b is another comparison diagram of sectional views of a signal line region, a TFT device region, and a pixel unit.

An array substrate is provided according to another embodiment of the disclosure. Similar parts of the array substrate according to the embodiment and the array substrate according to the embodiment are not further described here. As shown in FIG. 7b, in the array substrate according to the embodiment of the disclosure, a common electrode line 69 is further provided in the pixel region. The common electrode line 69 may be located above or below the common electrode 62, or the common electrode line 69 may be located in a same layer as the common electrode 62. The common electrode line is made of a metal material. Hence, a conductivity of the common electrode is increased. Accordingly, a response speed of the display apparatus is improved, and performance of the display apparatus is improved.

As shown in the display region 42 and the signal line region 412 in FIG. 7b, the pixel electrode 63 and the first plate 531 are located in a same layer and formed with a same material in a same process. The common electrode 62 and the second plate 521 are located in a same layer and formed with a same material in a same process. Thus no extra process is involved for manufacturing the capacitor and cost is accordingly saved. Since the positions of the pixel electrode and the common electrode may be exchanged, the first plate may be arranged below the second plate. Hence, the pixel electrode and the first plate may be located in a same layer and formed with a same material in a same process, and the common electrode and the second plate may be located in a same layer and formed with a same material in a same process. As shown in FIG. 7b, no hole is required to be provided on the plates of the capacitor since both the first plate and the second plate of the capacitor are made of a transparent material. The process is simplified and the UV transmittance is significantly improved when performing the seal agent hardening, thereby improving product productivity. Alternatively, the first plate 531 and one of the pixel electrode 63 and the common electrode 62 may be located in a same layer and formed with a same material in a same process. The second plate 521 is manufactured individually, or the second plate 521 and the common electrode line 69 are located in a same layer and formed with a same material in a same process. Similarly, the second plate 521 and one of the pixel electrode 63 and the common electrode 62 may be located in a same layer and formed with a same material in a same process. The first plate 531 is manufactured individually, or the first plate 531 and the common electrode line 69 are located in a same layer and formed with a same material in a same process. Since the positions of the pixel electrode and the common electrode may be exchanged, the first plate may be located below the second plate. The second plate and one of the common electrode and the pixel electrode may be located in a same layer and formed with a same material in a same process. The first plate is manufactured separately, or the first plate and the common electrode line are located in a same layer and formed with a same material in a same process. Similarly, the first plate and one of the pixel electrode and the common electrode may be located in a same layer and formed with a same material in a same process. The second plate is manufactured individually, or the second plate and the common electrode line are located in a same layer and formed with a same material in a same process.

According to the embodiment, the first plate and the second plate of the capacitor should be respectively electrically connected to a related TFT device in the gate driving circuit, to achieve functions of the capacitor, such as a signal coupling and a bootstrap, in the gate driving circuit. As shown in FIG. 7b, in the pixel unit in the display region 42, a third insulating layer 64 and a semiconductor layer 65 are provided between a gate metallic layer 61 and a data metallic layer 66, a fourth insulating layer 67 is provided between the data metallic layer 66 and the common electrode 62, and a fifth insulating layer 68 is provided between the common electrode 62 and the pixel electrode 63. In the TFT device region 411, a sixth insulating layer 74 and a semiconductor layer 75 are provided between a gate line metallic layer 71 and a data line metallic layer 76, and a seventh insulating layer 77 and a eighth insulating layer 78 are provided above the data line metallic layer. Here via holes may be provided. The first plate 531 of the capacitor located above the signal line region 412 is connected to a source electrode or a drain electrode of one TFT device in the gate driving circuit through a via hole 761, and the second plate 521 of the capacitor is connected to a gate electrode of the TFT device in the gate driving circuit through a via hole 762. The via hole 761 penetrates through the eighth insulating layer 78 and the seventh insulating layer 77 to expose the data line metallic layer 76. The via hole 762 penetrates through the seventh insulating layer 77 and the sixth insulating layer 74 to expose the gate line metallic layer 71. As circuit design requires, the first plate 531 of the capacitor may be connected to the gate electrode of the TFT device through a via hole, where the via hole penetrates through the eighth insulating layer 78, the seventh insulating layer 77 and the sixth insulating layer 74 to expose the gate metallic layer 71. The second plate 521 of the capacitor may be connected to the source electrode or the drain electrode of the TFT device through a via hole, where the via hole penetrates through the seventh insulating layer 77 to expose the data line metallic layer 76. It should be understood that, one of the first plate and the second plate of the capacitor may be electrically connected to one of the gate electrode and the source electrode or the drain electrode of the related TFT device through one via hole, while the other of the first plate and the second plate may be electrically connected to the other of the gate electrode and the source electrode or the drain electrode through another via hole. The via holes are not limited within the gate driving circuit region, and may be provided anywhere within the non-display region 41 based on circuit requirements.

As shown in FIG. 7b, a wire 73, which connects the first plate 531 of the capacitor to the source electrode or the drain electrode of the TFT device through the via hole 761, may be manufactured individually. Alternatively, the wire 73 and one of the pixel electrode 63, the common electrode 62 and the common electrode line 69 may be located in a same layer and formed with a same material in a same process. A wire 72, which connects the second plate 521 of the capacitor to the gate electrode of the TFT device through the via hole 762, may be manufactured individually. Alternatively, the wire 72 and one of the common electrode 62, the pixel electrode 63 and the common electrode line 69 may be located in a same layer and formed with a same material in a same process. The common electrode line is made of a metal material. Hence, the conductivity of the common electrode is increased and the capacitor may have a better performance. Since the positions of the pixel electrode and the common electrode may be exchanged, the first plate may be arranged below the second plate. A wire, which connects the second plate of the capacitor to the source electrode or the drain electrode of the TFT device through the via hole, may be manufactured individually. Alternatively, the wire and the common electrode or the pixel electrode or the common electrode line may be located in a same layer and formed with a same material in a same process. A wire, which connects the first plate of the capacitor to the gate electrode of the TFT device through the via hole, may be manufactured individually. Alternatively, the wire and the pixel electrode or the common electrode or the common electrode line may be located in a same layer and formed with a same material in a same process.

As shown in FIG. 7b, in the signal line region, the first insulating layer 54 is provided between the signal line 51 and the second plate 521, and the second insulating layer 58 is provided between the first plate 531 and the second plate 521. In the pixel unit in the display region 42, the third insulating layer 64 and the semiconductor layer 65 are provided between the gate line metallic layer 61 and the data line metallic layer 66, the fourth insulating layer 67 is provided between the data line metallic layer 66 and the common electrode 62, and the fifth insulating layer 68 is provided between the common electrode 62 and the pixel electrode 63. In the TFT device region 411, the sixth insulating layer 74 and the semiconductor layer 75 are provided between the gate line metallic layer 71 and the data line metallic layer 76, and the seventh insulating layer 77 and the eighth insulating layer 78 are provided above the data line metallic layer. The insulating layers include at least one of an organic layer and an inorganic layer, and may be single-layer films or laminated films. Generally, the third insulating layer 64 is a gate insulating layer, the fourth insulating layer 67 includes a passivation layer and an organic layer, and the fifth insulating layer 68 is a passivation layer. The sixth insulating layer 74 and the third insulating layer 64 may be located in a same layer and formed with a same material in a same process. The seventh insulating layer 77 and the fourth insulating layer 67 may be located in a same layer and formed with a same material in a same process. The eighth insulating layer 78 and the fifth insulating layer 68 may be located in a same layer and formed with a same material in a same process. The signal lines 51 may be arranged in a single layer same as the gate line metallic layer. Hence, the first insulating layer 54 and at least one layer in the third insulating layer 64 and the fourth insulating layer 67 may be located in a same layer and formed with a same material in a same process, i.e., the first insulating layer 54 may include at least one of the gate insulating layer, the passivation layer and the organic layer. Alternatively, the signal lines 51 may be arranged in a single layer same as the data line metallic layer. Hence, the first insulating layer 54 and at least one layer in the third insulating layer 64 may be located in a same layer and formed with a same material in a same process, i.e., the first insulating layer 54 may include at least one of the passivation layer and the organic layer. Alternatively, the signal lines 51 may be arranged in two layers, a part of the signal lines are located in a same layer as the gate metallic layer, and a part of the signal lines are located in a same layer as the data metallic layer. Hence, the first insulating layer 54 and at least one layer in the fourth insulating layer 67 may be located in a same layer and formed with a same material in a same process, i.e., the first insulating layer 54 may include at least one of the passivation layer and the organic layer. The second insulating layer 58 and the fifth insulating layer 68 may be located in a same layer and formed with a same material in a same process.

Since the capacitor is arranged above the signal lines, in order to maintain the capacitor stable, the first insulating layer 54 provided between the signal lines 51 and the second plate or the first plate should be thick enough, so that a pulse signal in the signal lines has no interference on the capacitor, or an interference caused by the pulse signal may not affect a normal operation of the capacitor. For this purpose, the first insulating layer 54 should have a thickness equal to or greater than 5000 Å.

The insulating layers may be single-layer films made of silicon nitride, silicon oxide or silicon oxynitride. Alternatively, the insulating layers may be laminated films made of the materials described above. The insulating layers may be manufactured through a chemical vapor deposition, a thermal evaporation or the like.

An array substrate is provided according to an embodiment of the disclosure. With the array substrate, the stability of a capacitor is improved.

To reduce an influence on the capacitor caused by a pulse signal and to further improve the stability of the capacitor, a wiring order for signal lines in a signal region may be changed when designing the layout, and a constant level signal such as a high level (VGH) signal and a low level (VGL) signal is applied to the signal lines below the capacitor. Since a reset signal (RESET) and a start signal (STP) may be considered as constant level signals in majority periods of time, they may also be applied to the signal lines.

Figure 8:
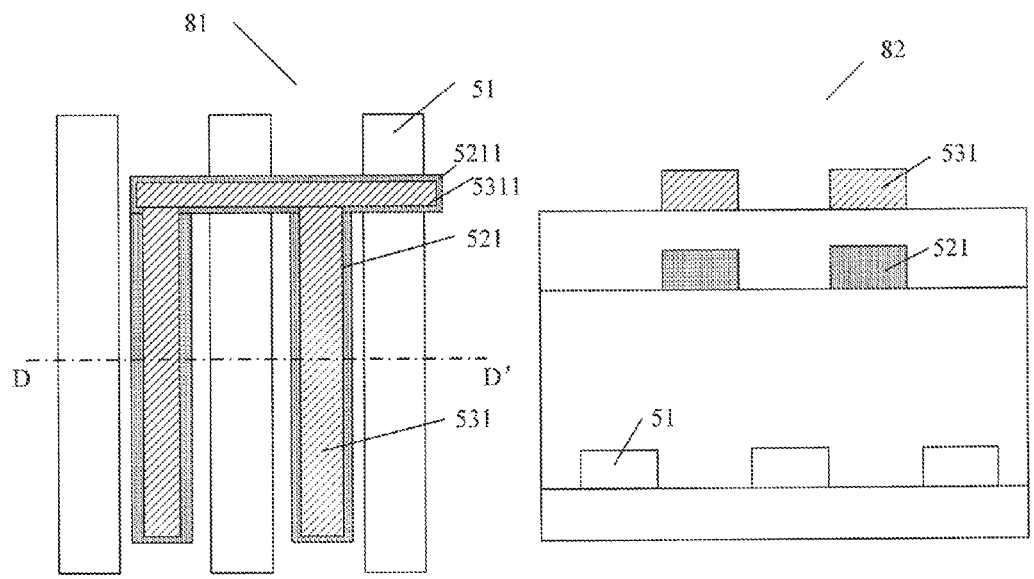
FIG. 8 illustrates a plane view of a signal line region and a sectional view, taken along the line D-D', of the signal line region.

FIG. 8 illustrates a plan view and a sectional view of a signal line region. As shown in FIG. 8, first plates 531 and second plates 521 of capacitors are strip-shaped and the strip-shaped plates do not overlap with the signal lines 51 below the capacitors, which are clearly shown in the sectional view taken along the line D-D'. In the sectional view, the first plates 531 are shown as having a same size as the second plates 521. While in the plan view, the first plates 531 have a smaller size than the second plates 532. This is merely for illustration and actual sizes of the plates may not be reflected in FIG. 8. In order to ensure that the capacitors may not be influenced by the signal applied to the signal lines below regardless whether the signal is a constant level signal or a pulse signal, the strip-shaped first plates are connected to each other by a wire 5311 and the strip-shaped second plates are connected to each other by a wire 5211. The wire 5311 and the strip-shaped first plates are located in a same layer and are formed with a same material in a same process. The wire 5211 and the strip-shaped second plates are located in a same layer and are formed with a same material in a same process.

Furthermore, the first plates and the second plates of the capacitors are not limited to be strip-shaped. Alternatively, the first plates and the second plates may be sheet-shaped, annular shaped, or lattice shaped. In the case that the capacitors overlap with the signal lines, the constant level signal may be applied to the signal lines below the capacitors or overlapping areas of the capacitors and the signal lines may be reduced, to reduce an influence on the capacitors caused by the pulse signal. In the case that sizes of the capacitors are sufficient, the first plates and the second plates are arranged without overlapping with the signal lines below.

Figure 9:
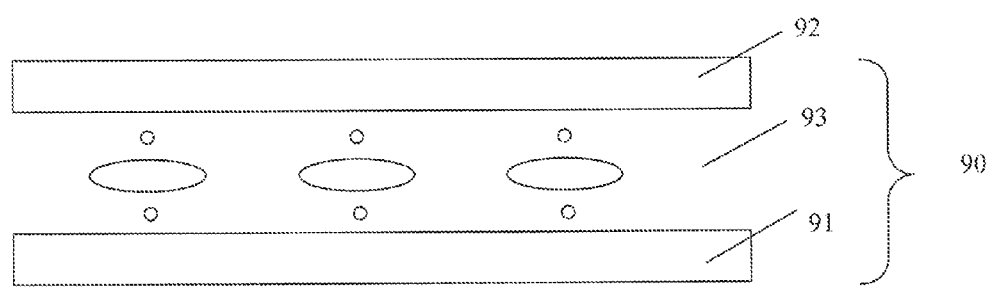
FIG. 9 is a schematic sectional view of a display apparatus according to an embodiment of the disclosure.

A display panel is provided according to another embodiment of the disclosure. The display panel includes the array substrate according to any one of the foregoing embodiments. The display panel may be a Liquid Crystal Display panel, an Organic Light Emitting Diode (OLED) display panel or the like. A liquid crystal display panel is shown in FIG. 9. The display panel 90 includes an array substrate 91 according to the foregoing embodiments, a color film substrate (CF) 92 having a color resist, and a liquid crystal layer 93. The CF 92 is arranged opposite to the array substrate 91, and the liquid crystal layer 93 is provided between the array substrate 91 and the CF 92.

A display apparatus is provided according to another embodiment of the disclosure. The display apparatus includes the display panel according to the previous embodiment. The display apparatus provided in the disclosure may be any products or components having a display function, such as a Liquid Crystal Display panel, an e-paper, an OLED panel, a Liquid Crystal Display Television, a Liquid Crystal Display, a digital photo frame, a mobile phone or a tablet PC. Since the capacitors are arranged in the signal line regions rather than the gate driving circuit regions, sizes of the gate driving circuits may be reduced. Accordingly, a width of a border of the display apparatus is further reduced and a narrow border design is achieved.

According to any one of the above described embodiments, the gate driving circuits may be symmetrically arranged on two exterior sides of the display region, i.e., a bilateral driving is implemented. Alternatively, the gate driving circuits may be arranged on one side out of the display region, i.e., a unilateral drive is implemented.

Although the present invention has been described with reference to the above embodiments, it is apparent to one of the ordinary skill in the art that modifications to the described embodiments may be made without departing from the scope of the invention. Accordingly, the scope of the invention will be defined by the appended claims not by the above described descriptions.

What is claimed is:

1. An array substrate comprising:
   a display region; and
   a non-display region, the non-display region comprising:
      a plurality of gate driving circuits; and
      a plurality of signal lines disposed outside the gate driving circuits, wherein:
         each of the gate driving circuits comprises at least one Thin Film Transistor (TFT) and a capacitor;
         the capacitor comprises a first plate and a second plate; and
         the capacitor is disposed in a particular layer that is vertically adjacent to one or more layers where the signal lines are disposed;
   wherein the first plate or the second plate is a transparent electrode layer;
   the array substrate further comprises:
   a plurality of pixel units in the display region, each of the pixel units comprising a gate line, a data line, a pixel electrode, and a common electrode, wherein:
      the signal lines and at least one of the gate lines and the data lines are located in a same layer, the pixel electrode and the first plate are located in a same layer, and the common electrode and the second plate are located in a same layer.

2. The array substrate according to claim 1, further comprising:
an organic layer disposed between the data line and the pixel electrode of a pixel unit in the display region, or an organic layer disposed between the data line and the common electrode in the display region;
an organic layer disposed between the signal line and the capacitor in the non-display region,
wherein the organic layer in the display region and the organic layer in the non-display region are located in a same layer.

3. The array substrate according to claim 2, wherein the organic layers each have a thickness equal to or greater than 5000 Å.

4. The array substrate according to claim 1, further comprising at least two via holes in the non-display region, wherein one of the first and second plates is electrically connected to one electrode of the TFT through one of the at least two via holes, and another one of the first and second plates is electrically connected to another electrode of the at least one TFT through another one of the at least two via holes.

5. The array substrate according to claim 4, wherein the pixel unit further comprises a common electrode line connected to the common electrode, the array substrate further comprises a metal electrode electrically connected to the first plate or to the second plate, the first plate or the second plate or the metal electrode is located in a same layer as the common electrode line, and the metal electrode is electrically connected to a gate electrode or a source electrode or a drain electrode of the at least one TFT through one of the via holes.

6. The array substrate according to claim 1, wherein the first plate and the second plate of the capacitor each are sheet-shaped, strip-shaped, annular shaped, or lattice shaped.

7. The array substrate according to claim 2, wherein at least one of the first and second plates is at least partially overlapped with the signal lines, and a constant level signal is applied to the signal lines; or the first and second plates do not overlap with the signal lines.

8. A display panel comprising an array substrate, the array substrate comprising a display region and a non-display region, the non-display region comprising a plurality of gate driving circuits and a plurality of signal lines disposed outside the gate driving circuits, wherein:
each of the gate driving circuits comprises at least one Thin Film Transistor (TFT) and a capacitor;
the capacitor comprises a first plate and a second plate; and
the capacitor is disposed in a particular layer that is vertically adjacent to one or more layers where the signal lines are disposed;
at least one of the first and second plates is a transparent electrode layer,
the display region comprises a plurality of pixel units, each of the pixel units comprising a gate line, a data line, a pixel electrode, and a common electrode,
the signal lines and at least one of the gate line and the data line are located in a same layer,
the pixel electrode and the first plate are located in a same layer, and
the common electrode and the second plate are located in a same layer.

9. The display panel according to claim 8, further comprising:
an organic layer disposed between the data line and the pixel electrode or between the data line and the common electrode in the display region,
an organic layer disposed between the signal line and the capacitor in the non-display region, wherein the organic layer in the display region and the organic layer in the non-display region are located in a same layer.

10. The display panel according to claim 8, further comprising:
at least two via holes in the non-display region;
one of the first and second plates being electrically connected to one electrode of the at least one TFT through one via hole, and
another one of the first and second plates being electrically connected to another electrode of the at least one TFT through another via hole;
wherein the pixel unit further comprises a common electrode line connected to the common electrode, the array substrate further comprises a metal electrode electrically connected to the first plate or to the second plate, the first plate or the second plate or the metal electrode is located in a same layer as the common electrode line, and the metal electrode is electrically connected to a gate electrode or a source electrode or a drain electrode of the at least one TFT through one of the via holes.

11. The display panel according to claim 8, wherein the first plate and the second plate of the capacitor each are sheet-shaped, strip-shaped, annular shaped or lattice shaped.

12. The display panel according to claim 11, wherein at least one of the first plate and the second plate is at least partially overlapped with the signal lines, and a constant level signal is applied to the signal lines; or the first plate and the second plate do not overlap with the signal lines.

13. A display apparatus comprising a display panel, the display panel comprising an array substrate, the array substrate comprising a display region and a non-display region, the non-display region comprising a plurality of gate driving circuits and a plurality of signal lines disposed outside the gate driving circuits, wherein:
each of the gate driving circuits comprises at least one Thin Film Transistor (TFT) and a capacitor;
the capacitor comprises a first plate and a second plate; and
the capacitor is disposed in a particular layer that is vertically adjacent to one or more layers where the signal lines are disposed;
at least one of the first and second plates is a transparent electrode layer;
the display region comprises a plurality of pixel units, each pixel unit comprising a gate line, a data line, a pixel electrode, and a common electrode,
the signal lines and at least one of the gate line and the data line are located in a same layer,
the pixel electrode and the first plate are located in a same layer, and
the common electrode and the second plate are located in a same layer.

14. The display apparatus according to claim 13, wherein further comprising:
an organic layer disposed between the data line and the pixel electrode or between the data line and the common electrode in the display region; and an organic layer disposed between the signal line and the capacitor in the non-display region, wherein the organic layer in the display region and the organic layer in the non-display region are located in a same layer.

15. The display apparatus according to claim 13, further comprising:
at least two via holes disposed in the non-display region;
one of the first plate and the second plate being electrically connected to one electrode of the at least one TFT through one of the at least two via holes, and
another one of the first plate and the second plate being electrically connected to another electrode of the at least one TFT through another via hole;
wherein:
the pixel unit further comprises a common electrode line connected to the common electrode,
the array substrate further comprises a metal electrode electrically connected to the first plate or to the second plate,
the first plate or the second plate or the metal electrode is located in a same layer as the common electrode line, and
the metal electrode is electrically connected to a gate electrode or a source electrode or a drain electrode of the at least one TFT through one of the at least two via holes.

16. The display apparatus according to claim 13, wherein the first plate and the second plate of the capacitor are sheet-shaped, strip-shaped, annular shaped, or lattice shaped; and
wherein at least one of the first plate and the second plate is at least partially overlapped with the signal lines, and a constant level signal is applied to the signal lines; or the first plate and the second plate do not overlap with the signal lines.

* * * * *

UNITED STATES PATENT AND TRADEMARK OFFICE
CERTIFICATE OF CORRECTION

PATENT NO. : 9,496,288 B2
APPLICATION NO. : 14/467650
DATED : November 15, 2016
INVENTOR(S) : Chao Wang and Zhaokeng Cao It is certified that error appears in the above-identified patent and that said Letters Patent is hereby corrected as shown below:

In the Claims

Column 13, Line 42, --claim 2-- should read --claim 6--

Signed and Sealed this
Eighteenth Day of April, 2017

Michelle K. Lee
*Director of the United States Patent and Trademark Office*